United States Patent
Liu et al.

(10) Patent No.: US 11,152,421 B2
(45) Date of Patent: Oct. 19, 2021

(54) SMALL-PITCH IMAGE SENSOR

(71) Applicant: OmniVision Technologies, Inc., Santa Clara, CA (US)

(72) Inventors: Yuanliang Liu, San Jose, CA (US); Vincent Venezia, Los Gatos, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 16/181,705

(22) Filed: Nov. 6, 2018

(65) Prior Publication Data
US 2020/0144323 A1 May 7, 2020

(51) Int. Cl.
*H01L 31/028* (2006.01)
*H01L 31/0288* (2006.01)
*H01L 27/146* (2006.01)
*H01L 21/266* (2006.01)

(52) U.S. Cl.
CPC ...... *H01L 27/14645* (2013.01); *H01L 21/266* (2013.01); *H01L 27/14621* (2013.01); *H01L 27/14627* (2013.01); *H01L 27/14687* (2013.01); *H01L 31/028* (2013.01); *H01L 31/0288* (2013.01)

(58) Field of Classification Search
CPC .............. H01L 27/14647; H01L 31/0288
See application file for complete search history.

(56) References Cited

U.S. PATENT DOCUMENTS

| 2006/0145202 A1* | 7/2006 | Sawase | H01L 27/1463 257/291 |
| 2011/0260221 A1* | 10/2011 | Mao | H01L 27/14698 257/291 |
| 2011/0310282 A1* | 12/2011 | Toda | H01L 31/022466 348/308 |
| 2015/0008482 A1* | 1/2015 | Sato | H01L 27/14643 257/183.1 |

OTHER PUBLICATIONS

Office Action, dated Dec. 9, 2020, issued in corresponding Taiwanese Application No. 108140009, filed Nov. 5, 2019, 17 pages.

* cited by examiner

*Primary Examiner* — Grant S Withers
(74) *Attorney, Agent, or Firm* — Christensen O'Connor Johnson Kindness PLLC

(57) ABSTRACT

Image sensor includes a first semiconductor material and a plurality of first doped regions disposed in the semiconductor material. The plurality of first doped regions is part of a plurality of photodiodes to receive light and convert the light into image charge. A second semiconductor material is disposed on the first semiconductor material, and a plurality of second doped regions is disposed in the second semiconductor. The plurality of second doped regions is electrically coupled to the plurality of first doped regions, and the plurality of second doped regions is part of the plurality of photodiodes.

7 Claims, 3 Drawing Sheets

SMALL-PITCH IMAGE SENSOR

TECHNICAL FIELD

This disclosure relates generally to electronic devices, and in particular but not exclusively, relates to image sensors.

BACKGROUND INFORMATION

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

When fabricating image sensors, high-energy implantation steps to form photodiodes in the image sensor may damage the semiconductor substrate leading to dark current and other image noise. Further, high-energy implants may limit scaling down the size of individual image sensor pixels.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
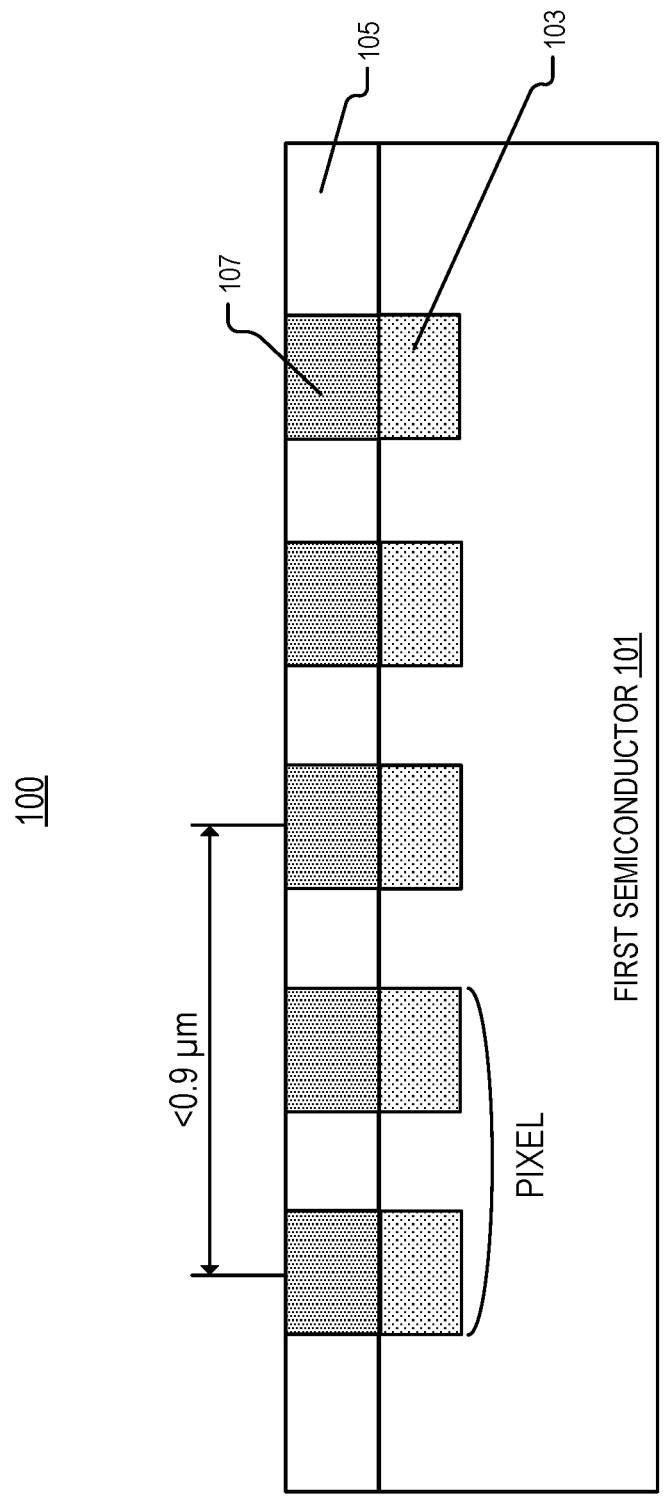
FIG. 1 shows a cross sectional diagram of a small-pitch image sensor, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a small-pitch image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

With pixel pitch size becoming smaller (e.g., 0.9 µm or below), lithography processes need to facilitate smaller critical dimensions for implanted layers (such as for deep pinning wells ("DPW"), and deep n-type pinned photodiode layers ("DNPPD1")). Currently both DPW and DNPPD1 layers are formed with a higher energy ion implantation step, which requires a thicker photoresist (e.g., >2.5 um) to block the implants where needed. Accordingly, it is difficult to have a small critical diameter with thick photoresist.

Here, the instant disclosure provides for reduced DPW and DNPPD1 implant energy through process optimization. Using lower implant energy allows for a thinner photoresist and improved resolution. Additionally, lowering the implant energy can reduce damage to the semiconductor crystal lattice, and improve white pixel and dark current performance in the image sensor.

In examples of the instant disclosure, lower energy implants are achieved by performing a first low energy implant into a first semiconductor material. Then a second semiconductor material may be epitaxially grown on the first semiconductor material. A second low-energy ion implantation step is then performed in the epitaxially grown silicon, thus creating a continuous well that is as deep as if a high-energy implant were performed, but using two low-energy implants. This allows for smaller pixel pitches.

The embodiments discussed above, and other embodiments, will be described below as they relate to the figures.

FIG. 1 shows a cross sectional diagram of small-pitch image sensor 100, in accordance with the teachings of the present disclosure. As shown, image sensor 100 includes first semiconductor material 101 and plurality of first doped regions 103 disposed in first semiconductor material 101. Plurality of first doped regions 103 is part of a plurality of photodiodes to receive light and convert the light into image charge. Second semiconductor material 105 is disposed on first semiconductor material 101, and plurality of second doped regions 107 is disposed in second semiconductor material 105. Plurality of second doped regions 107 is electrically coupled to plurality of first doped regions 103, and plurality of second doped regions 107 is part of the plurality of photodiodes. Put another way, first doped region 103 and second doped region 107 combined form part of a photodiode.

As will be discussed in greater detail below, first semiconductor material 101 may be single crystal silicon (e.g., a wafer or the like), and second semiconductor material 105 is epitaxially grown silicon. In the depicted example, plurality of first doped regions 103 is in physical contact with plurality of second doped regions 107 (e.g., second doped regions 107 extend all the way through second semiconductor material 105 to contact first doped regions 103). As shown, first doped regions 103 and second doped regions 107 are laterally coextensive with each other (e.g., the regions overlap with each other in the X direction on the page). In the depicted example, the edges of first doped regions 103 and second doped regions 107 are vertically aligned (e.g., to form parts of a continuous photodiode). In the depicted example, the pitch between pixels (e.g., groups of one or more photodiodes—e.g., four photodiodes) formed from the plurality of photodiodes is less than 0.9 µm. In the depicted example, this dimension is specific for capturing high-resolution images. In one example, dopant density in the plurality of first doped regions is different (greater than or less than, as measured in atoms/cm$^3$) than the dopant density in the plurality of second doped regions.

In some embodiments, color filters and micro lenses may be subsequently formed and optically aligned to direct light into the first and second doped regions. The color filter array may be a Bayer filter array or the like. The micro lenses may be made from polymer which is reflowed into a dome like structure above each doped region to direct light into the photodiodes. Light may be transmitted from the micro lenses through the color filter and into the photodiodes (including first doped regions 103 and second doped regions 107). One or more planarization/transparent oxide layers may be formed between the color filters and first semiconductor material 101, thus the color filter layer is disposed between the planarization layer and the micro lenses.

FIGS. 2A-2E illustrate a method of fabricating the small-pitch image sensor of FIG. 1, in accordance with the teachings of the present disclosure. The order in which some or all figures appear in the method should not be deemed limiting. Rather, one of ordinary skill in the art having the benefit of the present disclosure will understand that some of the method may be executed in a variety of orders not illustrated, or even in parallel. Furthermore, the method may omit certain figures in order to avoid obscuring certain aspects. Alternatively, the method may include additional figures that may not be necessary in some embodiments/examples of the disclosure.

Figure 2A:
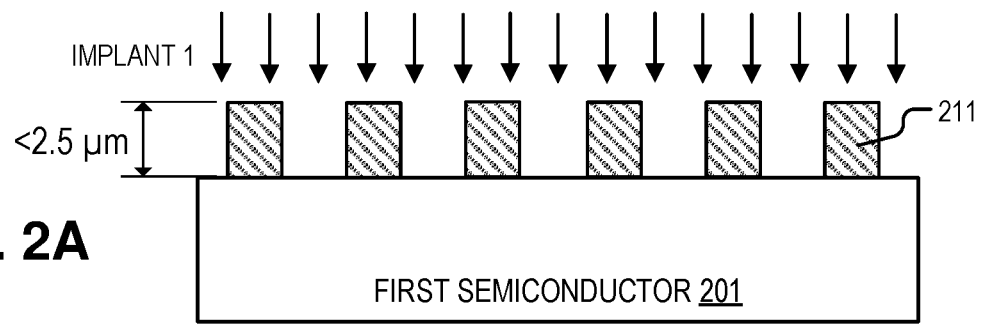
FIGS. 2A-2E illustrate a method of fabricating the small-pitch image sensor of FIG. 1, in accordance with the teachings of the present disclosure.

FIG. 2A shows providing first semiconductor material 201, and implanting plurality of first doped regions 203 in first semiconductor material 201. Plurality of first doped regions 203 is part of a plurality of photodiodes to receive light and convert the light into image charge. As shown, a first photoresist mask 211 is formed on first semiconductor material 201 prior to implanting plurality of first doped regions 203. As a result of low-energy impanation being used, photoresist mask 211 may be less than 2.5 µm thick and still block ions from reaching semiconductor material 101. Photoresist 211 may be a negative or positive resist.

Figure 2B:
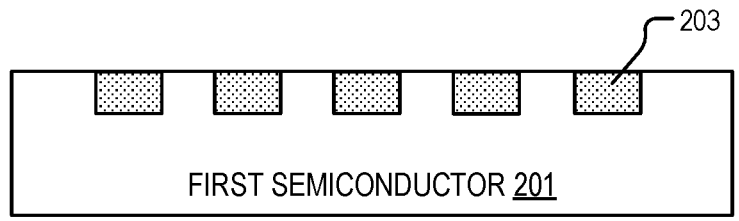

FIG. 2B illustrates the resultant first dopant regions 203 disposed in first semiconductor material 201 after photoresist 211 is removed (e.g., by solvent washing or the like).

Figure 2C:
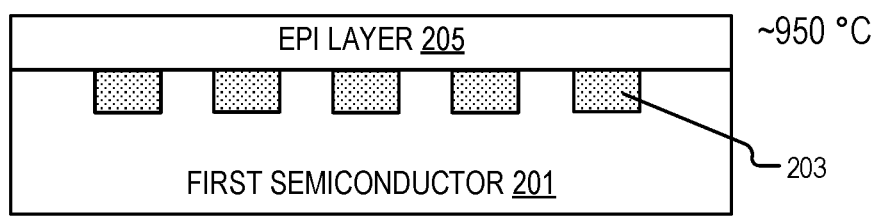

FIG. 2C depicts forming second semiconductor material 205 disposed on first semiconductor material 201. Second semiconductor material 205 may be formed by epitaxially growing silicon on first semiconductor material 201. Second semiconductor material 205 may be grown by placing first semiconductor material 201 in a reactor for chemical vapor deposition (CVD), atomic layer deposition (ALD), or the like. In the depicted example, depositing the silicon may include using an SiH$_4$ based precursor at less than 1050° C. (e.g., 950° C.) growing silicon at 0.1-0.3 microns/min. In this example, the temperature is critical to prevent diffusion of first doped regions 203 in the semiconductor material 201. However, in other examples other precursors may be used such as SiCl$_4$ (e.g., at 1150-1250° C.), SiHCl$_3$ (e.g., at 1100-1200° C.), or SiHCl$_2$ (e.g., at 1050-1150° C.).

Figure 2D:
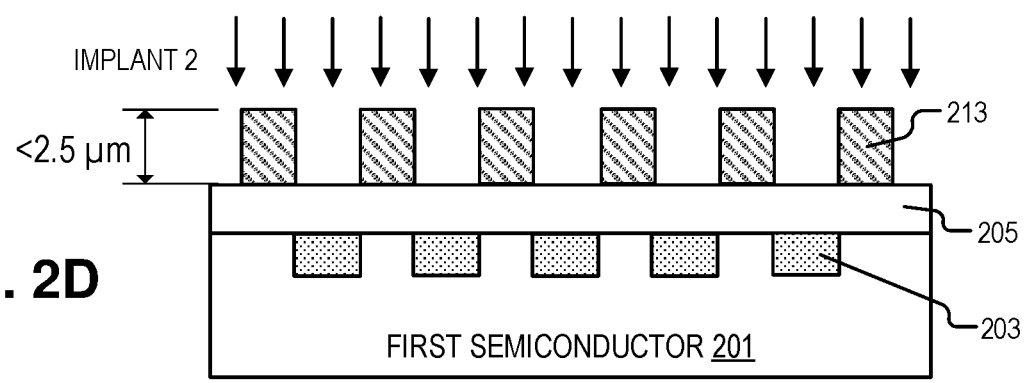

FIG. 2D shows forming second photoresist mask 213 on second semiconductor material 205 prior to implanting plurality of second doped regions 207. Like first photoresist mask 211, second photoresist mask 213 may be less than 2.5 µm thick.

FIG. 2D also illustrates implanting a plurality of second doped regions 207 in second semiconductor 205. As shown, plurality of second doped regions 207 are electrically coupled (and in direct physical contact with) plurality of first doped regions 203. Plurality of second doped regions 207 is also part of the plurality of photodiodes. In other embodiments, plurality of second doped regions 207 may include a different ion and be of an opposite majority charge carrier type as first doped regions 203 (e.g., first doped regions 203 include arsenic, and second doped regions 207 include boron). In this example, second doped regions 207 may be used to form a pinning layer of the photodiode, while first doped regions 203 form a well. However, in other examples, implanting plurality of first doped regions 203 and plurality of second doped regions 207 includes implanting a same ion (e.g., arsenic).

Figure 2E:
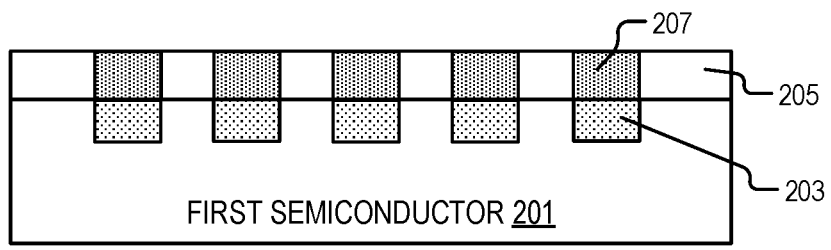

FIG. 2E illustrates washing away second photoresist 213. This leaves the formed first doped regions 203 and second doped regions 207 (which may be parts of a plurality of photodiodes arranged into pixels).

Figure 3:
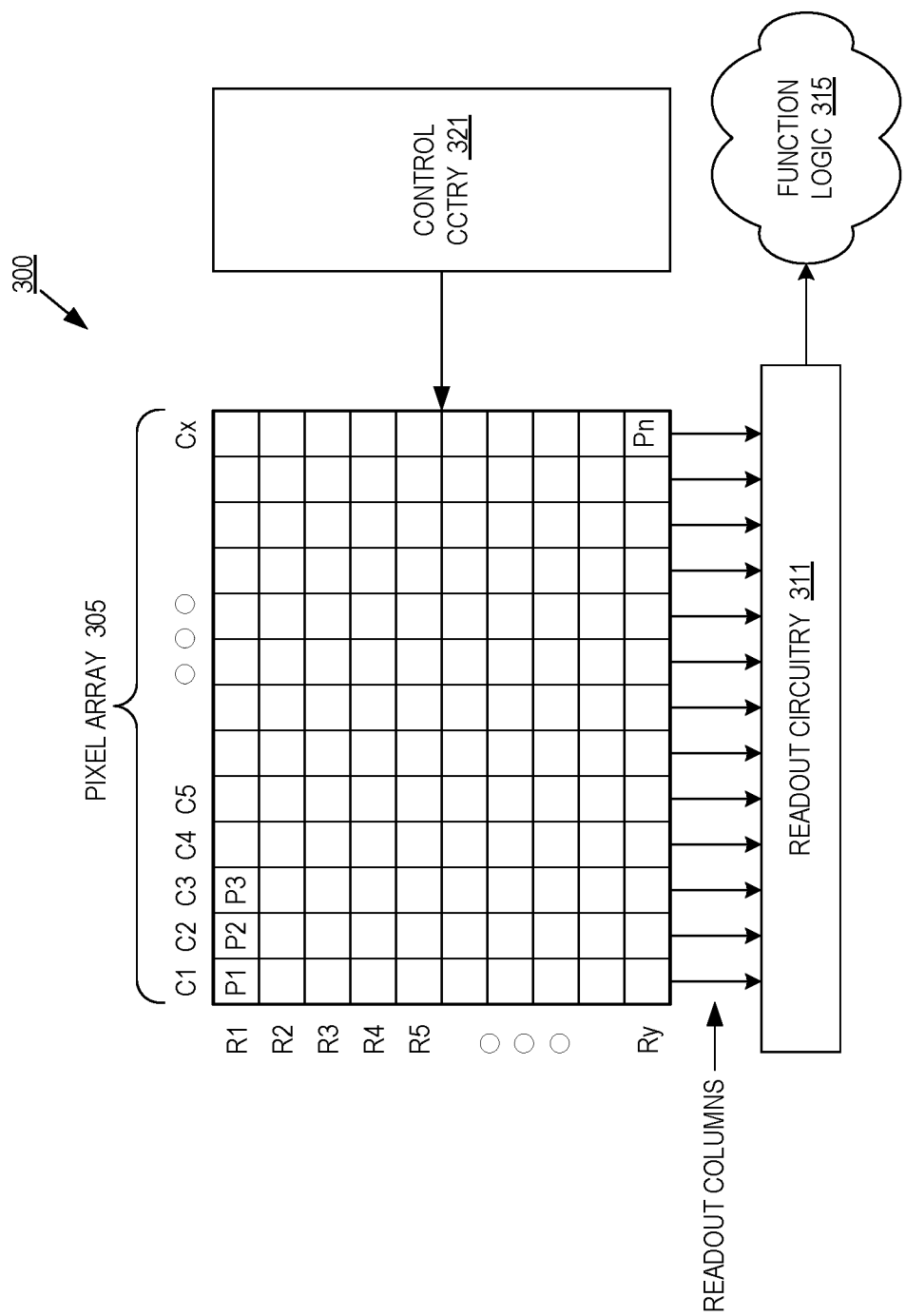
FIG. 3 depicts a block diagram of an imaging system including the image sensor of FIG. 1, in accordance with the teachings of the present disclosure.

FIG. 3 depicts a block diagram of an imaging system 300 including the image sensor of FIG. 1, in accordance with the teachings of the present disclosure. Imaging system 300 includes pixel array 305, control circuitry 321, readout circuitry 311, and function logic 315. In one example, pixel array 305 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 305 has acquired its image data or image charge, the image data is readout by readout circuitry 311 and then transferred to function logic 315. In various examples, readout circuitry 311 may include amplification circuitry, analog to digital conversion circuitry, and the like. Function logic 315 may simply store the image data or even manipulate the image data by applying post image effects (e.g., crop, rotate, remove red eye, adjust brightness, adjust contrast, or otherwise). In one example, readout circuitry 311 may readout a row of image data at a time along readout column lines (illustrated) or may readout the image data using a variety of other techniques, such as a serial readout or a full parallel readout of all pixels simultaneously.

In one example, control circuitry 321 is coupled to pixel array 305 to control operation of the plurality of photodiodes in pixel array 305. For example, control circuitry 321 may generate a shutter signal for controlling image acquisition. In one example, the shutter signal is a global shutter signal for simultaneously enabling all pixels within pixel array 305 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 300 may be included in an automobile, cell phone, camera, or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a first semiconductor material disposed in a first layer;
   a plurality of first doped regions disposed in the first semiconductor material, wherein individual first doped regions are vertically defined by their corresponding first edges against the first semiconductor material, wherein the plurality of first doped regions are part of a plurality of photodiodes to receive light and convert the light into image charge;
   a second semiconductor material disposed on the first semiconductor material as a second layer that is different from the first layer; and
   a plurality of second doped regions disposed in the second semiconductor material based on the positions of individual first doped regions, and extending through the second semiconductor material, wherein individual second doped regions are vertically defined by their corresponding second edges against the second semiconductor material, wherein the plurality of second doped regions are electrically coupled to the plurality of first doped regions such that first doped regions of the plurality of first doped regions are individually coupled to corresponding second doped regions of the plurality of second doped regions, wherein individual second doped regions of the plurality of second doped regions are in contact with respective individual first doped regions of the plurality of first doped regions without an intervening layer, and wherein the plurality of second doped regions are part of the plurality of photodiodes,
   wherein the first edges of the first doped regions of the plurality of first doped regions and the second edges of the respective second doped regions of the plurality of second doped regions are vertically aligned through a vertical extent of the first edges of the first doped regions and the second edges of the corresponding second doped regions, and
   wherein the first semiconductor material is single crystal Si and the second semiconductor material is epitaxially grown Si.

2. The image sensor of claim 1, wherein the pitch between pixels formed from the plurality of photodiodes is less than 0.9 µm.

3. The image sensor of claim 1, wherein the plurality of first doped regions and the plurality of second doped regions are of an opposite majority charge carrier type.

4. The image sensor of claim 3, wherein the plurality of first doped regions and the plurality of second doped regions include different dopant ions.

5. The image sensor of claim 1, further comprising control circuitry coupled to the plurality of photodiodes to control operation of the plurality of photodiodes.

6. The image sensor of claim 1, further comprising readout circuitry coupled to the plurality of photodiodes to readout image charge from the plurality of photodiodes.

7. The image sensor of claim 1, wherein a dopant density in the plurality of first doped regions is different than the dopant density in the plurality of second doped regions.

* * * * *